United States Patent
Okuno et al.

(10) Patent No.: US 9,166,102 B2
(45) Date of Patent: Oct. 20, 2015

(54) GROUP III NITRIDE SEMICONDUCTOR LIGHT-EMITTING DEVICE INCLUDING A SUPERLATICE LAYER

(71) Applicant: Toyoda Gosei Co., Ltd., Kiyosu-shi (JP)

(72) Inventors: Koji Okuno, Kiyosu (JP); Atsushi Miyazaki, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 64 days.

(21) Appl. No.: 13/920,684

(22) Filed: Jun. 18, 2013

(65) Prior Publication Data
US 2013/0299778 A1 Nov. 14, 2013

Related U.S. Application Data

(62) Division of application No. 13/064,536, filed on Mar. 30, 2011, now abandoned.

(30) Foreign Application Priority Data

Mar. 31, 2010 (JP) ................................. 2010-081138

(51) Int. Cl.
*H01L 33/00* (2010.01)
*H01L 33/06* (2010.01)
(Continued)

(52) U.S. Cl.
CPC ................ *H01L 33/06* (2013.01); *H01L 33/04* (2013.01); *H01L 33/32* (2013.01)

(58) Field of Classification Search
CPC ............ H01L 33/0062; H01L 33/0066; H01L 33/007; H01L 33/0075; H01L 33/04; H01L 33/12; H01L 33/32

USPC ................ 257/13, 14, 15, 22, 94, 96, 97, 103
See application file for complete search history.

(56) References Cited

U.S. PATENT DOCUMENTS 7,576,363 B2 8/2009 Uemura et al.
7,629,619 B2 * 12/2009 Taki et al. ....................... 257/96
(Continued)

FOREIGN PATENT DOCUMENTS

| JP | 11-191639 A | 7/1999 |
|----|-------------|--------|
| JP | 2007-180499 A | 7/2007 |
| JP | 2008-270805 A | 11/2008 |

OTHER PUBLICATIONS

Chinese Office Action dated Jan. 10, 2013 with English translation.
(Continued)

*Primary Examiner* — Jay C Kim
(74) *Attorney, Agent, or Firm* — McGinn IP Law Group, PLLC

(57) ABSTRACT

A Group III nitride semiconductor light-emitting device includes at least an n-type-layer-side cladding layer, a light-emitting layer, and a p-type-layer-side cladding layer, each of the layers being formed of a Group III nitride semiconductor. The n-type-layer-side cladding layer is a superlattice layer having a periodic structure including an $In_yGa_{1-y}N$ ($0<y<1$) layer, an $Al_xGa_{1-x}N$ ($0<x<1$) layer, and a GaN layer. The n-type-layer-side cladding layer has a four-layer periodic structure including a second GaN layer interposed between the $In_yGa_{1-y}N$ ($0<y<1$) layer and the $Al_xGa_{1-x}N$ ($0<x<1$) layer.

9 Claims, 5 Drawing Sheets

(51) Int. Cl.
*H01L 33/04* (2010.01)
*H01L 33/32* (2010.01)

(56) References Cited

U.S. PATENT DOCUMENTS

| | | | |
|---|---|---|---|
| 7,888,670 B2 | 2/2011 | Han et al. | |
| 8,030,673 B2 * | 10/2011 | Ubahara | 257/96 |
| 8,124,989 B2 | 2/2012 | Tsai | |
| 8,399,896 B2 * | 3/2013 | Hikosaka et al. | 257/94 |
| 2008/0251781 A1 | 10/2008 | Han et al. | |
| 2009/0057694 A1 | 3/2009 | Tsai | |

OTHER PUBLICATIONS

US Office Action dated Nov. 6, 2012 for co-pending related U.S. Appl. No. 13/064,536.
US Office Action dated Mar. 18, 2013 for co-pending related U.S. Appl. No. 13/064,536.
Rubio et al., "Quasiparticle band structure of AIN and GaN", Physcial Review B 48 (1993) pp. 11810-11816.
Japanese Office Action dated Nov. 26, 2013, with partial English translation.

* cited by examiner

GROUP III NITRIDE SEMICONDUCTOR LIGHT-EMITTING DEVICE INCLUDING A SUPERLATICE LAYER

The present application is a Divisional application of U.S. patent application Ser. No. 13/064,536, filed on Mar. 30, 2011, which is based on and claims priority from Japanese patent application No. 2010-08138, filed on Mar. 31, 2010, the entire contents of which is incorporated herein by reference.

BACKGROUND OF THE INVENTION

1. Field of the Invention

The present invention relates to a Group III nitride semiconductor light-emitting device which suppresses an increase in driving voltage and which exhibits improved emission performance.

2. Background Art

Hitherto, various known Group III nitride semiconductor light-emitting devices are known, and some of them are disclosed in Japanese Patent Application Laid-Open (kokai) Nos. H11-191639 and 2007-180499. Japanese Patent Application Laid-Open (kokai) No. H11-191639 discloses a Group III nitride semiconductor light-emitting device having a structure in which a light-emitting layer is stacked on n-type layers; i.e., a third layer bonded to the light-emitting layer, a second layer bonded to the third layer, and a first layer bonded to the second layer. The second layer has a superlattice structure formed of two layers (AlGaN layer and GaN layer) or a superlattice structure formed of two layers (AlGaN layer and InGaN layer), and the third layer has an impurity concentration lower than that of the second layer. This configuration of the device reduces driving voltage.

Japanese Patent Application Laid-Open (kokai) No. 2007-180499 discloses a Group III nitride semiconductor light-emitting device including a substrate, an n-type semiconductor layer on which an n-electrode is formed, and an intermediate layer provided between the substrate and the n-type semiconductor layer and having a periodic structure formed of AlGaN, GaN, and InGaN. The intermediate layer improves the crystallinity of the n-type semiconductor layer which serves as a current path and on which the n-electrode is formed, thereby improving the reliability of the device. In this device, propagation of threading dislocations generated in a layer provided below the intermediate layer into a layer provided above the intermediate layer is blocked by means of the periodic structure of the intermediate layer. This configuration of the device improves the crystallinity of the layer provided above the intermediate layer, thereby improving emission performance, reverse breakdown voltage, and electrostatic breakdown voltage.

However, as described in Japanese Patent Application Laid-Open (kokai) No. H11-191639, when the second layer, which is not directly bonded to the light-emitting layer, has a superlattice structure formed of AlGaN and GaN layers or a superlattice structure formed of AlGaN and InGaN layers, reduction of driving voltage fails to be attained. In addition, since the AlGaN layer acts as a barrier against electrons, resistance to electrons is not reduced, and confinement of holes in the light-emitting layer is not improved. In the device disclosed in Japanese Patent Application Laid-Open (kokai) No. 2007-180499, the light-emitting layer exhibits improved crystallinity, but confinement of holes in the light-emitting layer fails to be attained, and resistance to electrons is not reduced. Thus, these conventional devices fail to achieve both reduction of driving voltage and improvement of emission performance.

SUMMARY OF THE INVENTION

The present invention has been accomplished for solving such a problem. An object of the present invention is to improve emission performance without increasing driving voltage, by effectively confining holes in a light-emitting layer without causing an increase in resistance to electrons.

In a first aspect of the present invention, there is provided a Group III nitride semiconductor light-emitting device comprising at least an n-type-layer-side cladding layer, a light-emitting layer, and a p-type-layer-side cladding layer, each of the layers being formed of a Group III nitride semiconductor, wherein the n-type-layer-side cladding layer is a superlattice layer having a periodic structure including an $In_yGa_{1-y}N$ ($0<y<1$) layer, an $Al_xGa_{1-x}N$ ($0<x<1$) layer, and a GaN layer. In the first aspect of the invention, the initial layer or final layer of the superlattice layer may be any one of the $In_yGa_{1-y}N$ ($0<y<1$) layer, the $Al_xGa_{1-x}N$ ($0<x<1$) layer, and the GaN layer. The initial layer (i.e., the layer most distal from the light-emitting layer) is not necessarily the $In_yGa_{1-y}N$ ($0<y<1$) layer, and the final layer (i.e., the layer most proximal to the light-emitting layer) is not necessarily the GaN layer. The superlattice layer may have a periodic structure formed of layer units each including the $In_yGa_{1-y}N$ ($0<y<1$) layer, the $Al_xGa_{1-x}N$ ($0<x<1$) layer, and the GaN layer, which are stacked in this order toward the light-emitting layer, wherein the initial layer of the periodic structure may be any of these semiconductor layers. Alternatively, the superlattice layer may have a periodic structure formed of layer units each including the $In_yGa_{1-y}N$ ($0<y<1$) layer, the GaN layer, and the $Al_xGa_{1-x}N$ ($0<x<1$) layer, which are stacked in this order toward the light-emitting layer, wherein the initial layer of the periodic structure may be any of these semiconductor layers. The initial layer of one layer unit of the periodic structure (i.e., the layer most distal from the light-emitting layer) may be any one of the $In_yGa_{1-y}N$ ($0<y<1$) layer, the $Al_xGa_{1-x}N$ ($0<x<1$) layer, and the GaN layer, and is not necessarily the $In_yGa_{1-y}N$ ($0<y<1$) layer.

In the semiconductor light-emitting device of the present invention, generally, an n-type contact layer for forming an n-electrode is provided below the n-type cladding layer, and a p-type contact layer for forming a p-electrode is provided above the p-type-layer-side cladding layer. The semiconductor light-emitting device of the present invention may include a layer other than the aforementioned layers. The light-emitting layer may have a single quantum well structure or a multiple quantum well structure.

In a second aspect of the present invention, the $Al_xGa_{1-x}N$ ($0<x<1$) layer has such a thickness that electrons tunnel through the $Al_xGa_{1-x}N$ layer and holes are confined in the light-emitting layer. Among the $In_yGa_{1-y}N$ ($0<y<1$) layer, the $Al_xGa_{1-x}N$ ($0<x<1$) layer, and the GaN layer, which form the periodic structure, the $Al_xGa_{1-x}N$ ($0<x<1$) layer acts as a barrier against holes contained in the light-emitting layer, and exhibits the effect of confining holes in the light-emitting layer. However, when electrons are injected from the n-type contact layer provided below the n-type-layer-side cladding layer into the light-emitting layer, the $Al_xGa_{1-x}N$ ($0<x<1$) layer acts as a barrier against electrons. Since the de Broglie wavelength of electrons is greater than that of holes, electron tunneling length is larger than hole tunneling length. Therefore, the thickness of the $Al_xGa_{1-x}N$ ($0<x<1$) layer can be adjusted to such a level that electrons can tunnel therethrough and holes cannot tunnel therethrough. Thus, electrons can be effectively injected from the n-type contact layer into the light-emitting layer, and the $Al_xGa_{1-x}N$ (0<x<1) layer can act as a barrier layer for holes injected from the p-contact layer into the light-emitting layer, whereby holes can be effectively confined in the light-emitting layer. As a result, emission performance can be improved without increasing driving voltage.

In a third aspect of the present invention, the $Al_xGa_{1-x}N$ (0<x<1) layer has a thickness of 0.3 nm to 2.5 nm. When the thickness falls within this range, electrons can tunnel through the $Al_xGa_{1-x}N$ (0<x<1) layer, and passage of holes can be blocked by the layer.

In a fourth aspect of the present invention, the $Al_xGa_{1-x}N$ (0<x<1) layer has an Al compositional proportion x of 0.05 or more and less than 1. When the Al compositional proportion is larger, the barrier hight becomes higher, and thus the thickness of the layer must be reduced. When the thickness of the layer is appropriately regulated while the Al compositional proportion is adjusted so as to fall within the above range, electrons can tunnel through the layer, and passage of holes can be blocked by the layer.

In a fifth aspect of the present invention, the p-type-layer-side cladding layer is formed of a superlattice layer including an $Al_zGa_{1-z}N$ (0<z<1) layer, and the $Al_xGa_{1-x}N$ (0<x<1) layer of the n-type-layer-side cladding layer has a compositional proportion x of ½ or more of the compositional proportion z of the $Al_zGa_{1-z}N$ (0<z<1) layer of the p-type-layer-side cladding layer. With this configuration, holes pass through the p-type-layer-side cladding layer, and passage of holes is blocked by the $Al_xGa_{1-x}N$ (0<x<1) layer (i.e., barrier layer) of the n-type-layer-side cladding layer. In contrast, electrons pass through the n-type-layer-side cladding layer, and passage of electrons is blocked by the p-type-layer-side cladding layer. Thus, electrons and holes are effectively confined in the light-emitting layer without increasing driving voltage, and emission performance is improved.

In a sixth aspect of the present invention, at least one of the $In_yGa_{1-y}N$ (0<y<1) layer, the $Al_xGa_{1-x}N$ (0<x<1) layer, and the GaN layer, which form the n-type-layer-side cladding layer, preferably contains Si. Needless to say, all the layers forming the n-type-layer-side cladding layer may contain Si. Both the $Al_xGa_{1-x}N$ (0<x<1) layer and the GaN layer may contain Si, and the $In_yGa_{1-y}N$ (0<y<1) layer may contain no impurity. Alternatively, both the $In_yGa_{1-y}N$ (0<y<1) layer and the GaN layer may contain Si, and the $Al_xGa_{1-x}N$ (0<x<1) layer may contain no impurity. Alternatively, both the $Al_xGa_{1-x}N$ (0<x<1) layer and the $In_yGa_{1-y}N$ (0<y<1) layer may contain Si, and the GaN layer may contain no impurity.

In a seventh aspect of the present invention, the light-emitting layer is formed directly on the n-type-layer-side cladding layer. With this configuration, electrons can be effectively injected into the light-emitting layer, and holes can be effectively confined in the light-emitting layer.

In an eighth aspect of the present invention, the p-type-layer-side cladding layer is a superlattice layer having a periodic structure including an $In_wGa_{1-w}N$ layer and an $Al_zGa_{1-z}N$ (0<z<1) layer. With this configuration, electrons can be effectively confined in the light-emitting layer, and holes can be effectively injected into the light-emitting layer, resulting in improvement of emission performance.

In a ninth aspect of the present invention, the n-type-layer-side cladding layer has a four-layer periodic structure including a second GaN layer interposed between the $In_yGa_{1-y}N$ (0<y<1) layer and the $Al_xGa_{1-x}N$ (0<x<1) layer. With this configuration, the difference in lattice constant between adjacent layers can be reduced, and the crystallinity of the $Al_xGa_{1-x}N$ (0<x<1) layer or the $In_yGa_{1-y}N$ (0<y<1) layer can be improved. In addition, formation of an $Al_xGa_{1-x-y}In_yN$ (0<x<1, 0<y<1, 0<x+y<1) layer is prevented between adjacent layers. Thus, the light-emitting device exhibits improved characteristics.

As used herein, "Group III nitride semiconductor" encompasses a compound semiconductor represented by the formula $Al_{x1}Ga_{y1}In_{z1}N$ (x1+y1+z1=1, 0≤x1, y1, z1≤1); such a compound semiconductor in which a portion of Al, Ga, or In is substituted by another Group 13 element (i.e., B or Tl), or a portion of N is substituted by another Group 15 element (i.e., P, As, Sb, or Bi). Generally, the Group III nitride semiconductor is one containing Ga as an essential element, such as GaN, AlGaN, InGaN, or AlGaInN.

The light-emitting layer may have a single quantum well structure or a multiple quantum well structure. Examples of the multiple quantum well structure which may be employed include a multiple quantum well structure of AlGaN/GaN having any compositional proportions, a multiple quantum well structure of InGaN/GaN having any compositional proportions, a multiple quantum well structure of AlGaN/InGaN having any compositional proportions, a multiple quantum well structure of AlGaN/GaN/InGaN having any compositional proportions, and a multiple quantum well structure of GaN/AlGaN having high Al compositional proportion/AlGaN having low Al compositional proportion/InGaN. The semiconductor light-emitting device of the present invention may further include a layer other than those described above, such as an n-type contact layer or a p-type contact layer. A layer for improving electrostatic breakdown voltage (hereinafter may be referred to as an "ESD layer") may be provided between the substrate and the n-contact layer. The device may have any other layer configuration.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
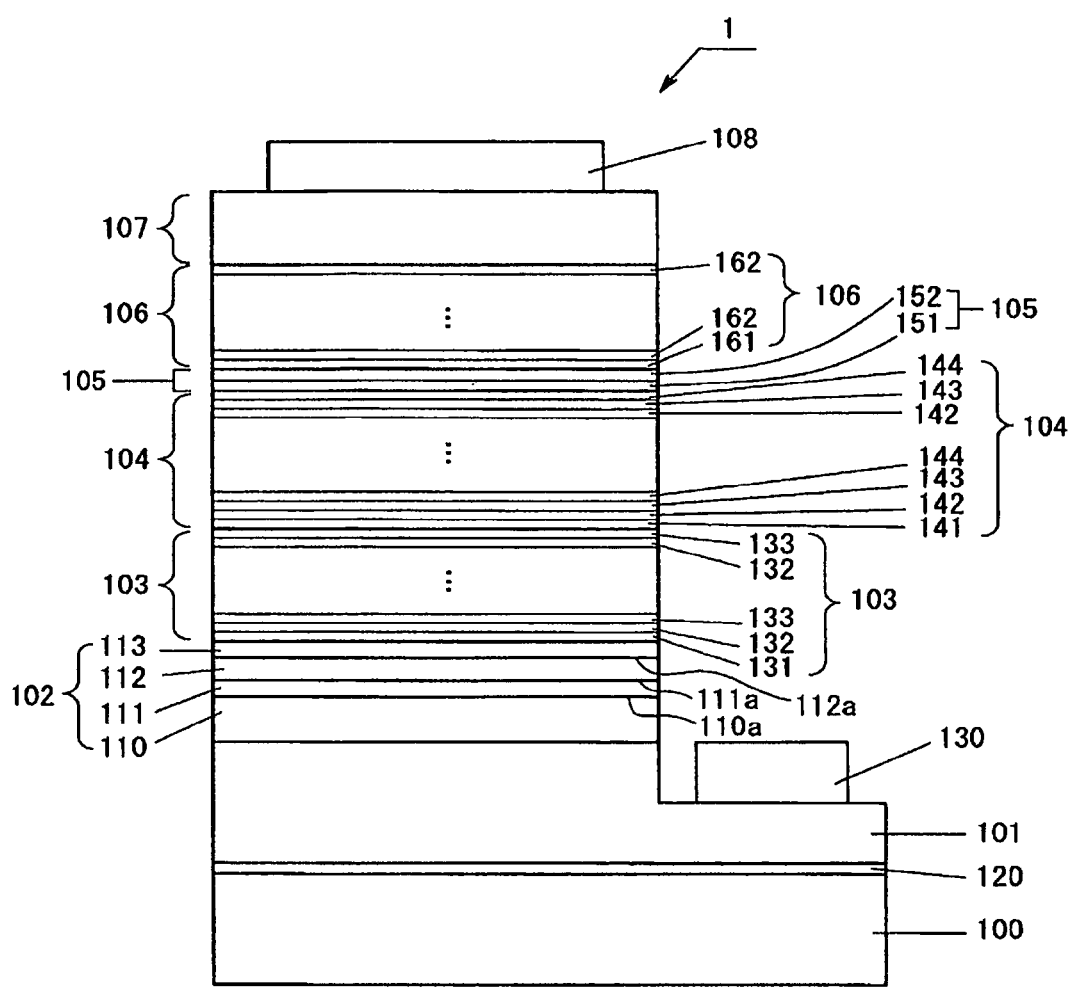
FIG. 1 shows the configuration of a light-emitting device 1 according to Embodiment 1.

FIG. 1 shows the configuration of a light-emitting device 1 according to Embodiment 1. The light-emitting device 1 has a structure including a sapphire substrate 100; an AlN buffer layer 120; an n-type contact layer 101, an ESD layer 102, an n-type-layer-side cladding layer (referred to as "n-type cladding layer" throughout the Embodiments) 103, a light-emitting layer 104, an undoped cladding layer 105, a p-type-layer-side cladding layer (referred to as "p-type cladding layer" throughout the Embodiments) 106, and a p-type contact layer 107, the layers 101 to 107 being formed of a Group III nitride semiconductor and deposited on the substrate 100 via the buffer layer 120; a p-electrode 108 formed on the p-type contact layer 107; and an n-electrode 130 formed on a portion of the n-type contact layer 101 exposed through removal of the corresponding portions of the layers 102 to 107 by etching from the p-type contact layer 107.

The surface of the sapphire substrate 100 is embossed for improving light extraction performance. The sapphire substrate may be replaced with another growth substrate made of, for example, SiC, ZnO, Si, or GaN.

The n-type contact layer 101 is formed of n-GaN having an Si concentration of $1\times10^{18}/cm^3$ or more. The n-type contact layer 101 may be formed of a plurality of layers having different carrier concentrations for attaining good contact between the layer 101 and the n-electrode 130.

The ESD layer 102 has a four-layer structure including a first ESD layer 110, a second ESD layer 111, a third ESD layer 112, and a fourth ESD layer 113, the layers 110 to 113 being sequentially deposited on the n-type contact layer 101. The first ESD layer 110 is formed of n-GaN having an Si concentration of $1\times10^{16}$ to $5\times10^{17}/cm^3$. The first ESD layer 110 has a thickness of 200 to 1,000 nm. The surface 110a of the first ESD layer 110 has few pits attributed to threading dislocations (pit density: $1\times10^8/cm^2$ or less).

The second ESD layer 111 is formed of GaN doped with Si, and has a characteristic value, as defined by the product of Si concentration ($/cm^3$) and thickness (nm), of $0.9\times10^{20}$ to $3.6\times10^{20}$ (nm/$cm^3$). For example, when the second ESD layer 111 has a thickness of 30 nm, the layer has an Si concentration of $3.0\times10^{18}$ to $1.2\times10^{19}/cm^3$.

The third ESD layer 112 is formed of undoped GaN. The third ESD layer 112 has a thickness of 50 to 200 nm. The surface 112a of the third ESD layer 112 also has pits (pit density: $2\times10^8/cm^2$ or more). Although the third ESD layer 112 is formed of undoped GaN, the layer has a carrier concentration (attributed to residual carriers) of $1\times10^{16}$ to $1\times10^{17}/cm^3$. The third ESD layer 112 may be doped with Si such that the layer has a carrier concentration of $5\times10^{17}/cm^3$ or less.

The fourth ESD layer 113 is formed of GaN doped with Si, and has a characteristic value, as defined by the product of Si concentration ($/cm^3$) and thickness (nm), of $0.9\times10^{20}$ to $3.6\times10^{20}$ (nm/$cm^3$). For example, when the fourth ESD layer 113 has a thickness of 30 nm, the layer has an Si concentration of $3.0\times10^{18}$ to $1.2\times10^{19}/cm^3$.

The n-type cladding layer 103 has a superlattice structure including 15 layer units, each including sequentially stacked three layers: an undoped $In_{0.077}Ga_{0.923}N$ layer 131 (thickness: 4 nm), an undoped $Al_{0.2}Ga_{0.8}N$ layer 132 (thickness: 0.8 nm), and an Si-doped n-GaN layer 133 (thickness: 1.6 nm). The initial layer of the n-type cladding layer 103, which is in contact with the fourth ESD layer 113, is the $In_{0.077}Ga_{0.923}N$ layer 131, and the final layer of the n-type cladding layer 103, which is in contact with the light-emitting layer 104, is the n-GaN layer 133. The overall thickness of the n-type cladding layer 103 is 96 nm. The $In_{0.077}Ga_{0.923}N$ layer 131 may have a thickness of 1.5 nm to 5.0 nm. The $Al_{0.2}Ga_{0.8}N$ layer 132 may have a thickness of 0.3 nm to 2.5 nm. The n-GaN layer 133 may have a thickness of 0.3 nm to 2.5 nm.

The light-emitting layer (may also be referred to as "active layer") 104 has an MQW structure including eight layer units, each including sequentially stacked four layers: an $Al_{0.05}Ga_{0.95}N$ layer 141 (thickness: 2.4 nm), an $In_{0.2}Ga_{0.8}N$ layer 142 (thickness: 3.2 nm), a GaN layer 143 (thickness: 0.6 nm), and an $Al_{0.2}Ga_{0.8}N$ layer 144 (thickness: 0.6 nm). The initial layer of the light-emitting layer 104, which is in contact with the n-type cladding layer 103, is the $Al_{0.05}Ga_{0.95}N$ layer 141, and the final layer of the light-emitting layer 104, which is in contact with the undoped cladding layer 105, is the $Al_{0.2}Ga_{0.8}N$ layer 144. The overall thickness of the light-emitting layer 104 is 54.4 nm. All the layers of the light-emitting layer 104 are formed of undoped layers. The undoped cladding layer 105 interposed between the light-emitting layer 104 and the p-type cladding layer 106 includes an undoped GaN layer 151 (thickness: 2.5 nm) and an undoped $Al_{0.15}Ga_{0.85}N$ layer 152 (thickness: 3 nm). The undoped cladding layer 105 is provided for the purpose of preventing diffusion of Mg contained in the layers formed above the layer 105 to the light-emitting layer 104.

The p-type cladding layer 106 has a structure including seven layer units, each including a p-$In_{0.05}Ga_{0.95}N$ layer 161 (thickness: 1.7 nm) and a p-$Al_{0.3}Ga_{0.7}N$ layer 162 (thickness: 3.0 nm) which are sequentially stacked. The initial layer of the p-type cladding layer 106, which is in contact with the undoped cladding layer 105, is the p-$In_{0.05}Ga_{0.95}N$ layer 161, and the final layer of the p-type cladding layer 106, which is in contact with the p-type contact layer 107, is the p-$Al_{0.3}Ga_{0.7}N$ layer 162. The overall thickness of the p-type cladding layer 106 is 32.9 nm. Mg is employed as a p-type impurity.

The p-type contact layer 107 is formed of p-GaN doped with Mg. The p-type contact layer 107 may be formed of a plurality of layers having different carrier concentrations for attaining good contact between the layer 107 and the p-electrode.

Since the ESD layer 102 has the aforementioned configuration, the light-emitting device 1 exhibits high electrostatic breakdown voltage, improved emission performance and reliability, and reduced current leakage. Next will be described the reason why the ESD layer 102 is configured as mentioned above. The ESD layer 102 is configured such that, firstly, the first ESD layer 110 having few pits is formed; the second ESD layer 111 is formed on the first ESD layer 110; the third ESD layer 112 having pits (pit density: $2\times10^8/cm^2$ or more) is formed on the second ESD layer 111; and the fourth ESD layer 113 is formed on the third ESD layer 112 having pits. With this configuration, high electrostatic breakdown voltage is attained. However, since the pit size depends on the thickness of the third ESD layer 112 (i.e., the thickness of the third ESD layer 112 and the pit size cannot be independently controlled), when higher electrostatic breakdown voltage is to be attained by increasing the thickness of the third ESD layer 112, the pit size increases, and the emission area decreases, resulting in reduction of emission performance, an increase in current leakage, and poor reliability. That is, electrostatic breakdown voltage and current leakage, reliability, or emission performance are in a trade-off relationship.

Therefore, the ESD layer 102 is configured such that the second ESD layer 111 and the third ESD layer 112 are provided on the first ESD layer 110 formed of a good crystal having a pit density of $1\times10^8/cm^2$ or less, and so that the pit size and the total thickness of the first ESD layer 110 and the third ESD layer 112 can be independently controlled by regulating the thickness of the first ESD layer 110 or the thickness of the third ESD layer 112. The thickness of the third ESD layer 112 is adjusted to 50 to 200 nm so that electrostatic breakdown voltage and emission performance are not reduced, and so that the pit size is regulated so as not to cause an increase in current leakage. In addition, the thickness of the first ESD layer 110 is adjusted to 200 to 1,000 nm for compensating reduction of the thickness of the third ESD layer 112, so as to attain high electrostatic breakdown voltage. The first ESD layer 110 is doped with Si (Si concentration: $1 \times 10^{16}$ to $5 \times 10^{17}/cm^3$) so as to match the conductivity of the first ESD layer 110 to that of the third ESD layer 112. Thus, an increase in forward voltage is prevented.

In order to further improve electrostatic breakdown voltage, emission performance, and reliability, and to reduce current leakage, preferably, the ESD layer 102 is configured as follows. The first ESD layer 110 preferably has a thickness of 300 to 700 nm, an Si concentration of $5 \times 10^{16}$ to $5 \times 10^{17}/cm^3$, and a pit density of $1 \times 10^7/cm^2$ or less. The second ESD layer 112 preferably has a characteristic value of $1.5 \times 10^{20}$ to $3.6 \times 10^{20}$ $nm/cm^3$ and a thickness of 25 to 50 nm. The third ESD layer 112 preferably has a thickness of 50 to 200 nm and a pit density of $2 \times 10^8$ to $1 \times 10^{10}/cm^2$. The fourth ESD layer 113 preferably has a characteristic value of $1.5 \times 10^{20}$ to $3.6 \times 10^{20}$ $nm/cm^3$ and a thickness of 25 to 50 nm.

Next will be described a method for producing the light-emitting device 1 with reference to FIG. 2. In FIG. 2, description of the periodic structures of the superlattice layers shown in FIG. 1 is omitted.

Crystal growth is carried out through metal-organic chemical vapor deposition (MOCVD). The gases employed are as follows: hydrogen or nitrogen ($H_2$ or $N_2$) as a carrier gas; ammonia gas ($NH_3$) as a nitrogen source; trimethylgallium ($Ga(CH_3)_3$, hereinafter may be referred to as "TMG") as a Ga source; trimethylindium ($In(CH_3)_3$, hereinafter may be referred to as "TMI") as an In source; trimethylaluminum ($Al(CH_3)_3$, hereinafter may be referred to as "TMA") as an Al source; silane ($SiH_4$) as an n-type dopant gas; and cyclopentadienylmagnesium ($Mg(C_5H_5)_2$, hereinafter may be referred to as "$Cp_2Mg$") as a p-type dopant gas.

Figure 2A:
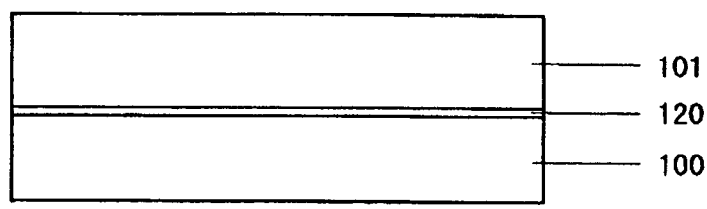
FIGS. 2A to 2C are sketches showing processes for producing the light-emitting device 1.

Firstly, the sapphire substrate 100 was heated in a hydrogen atmosphere for cleaning, to thereby remove deposits from the surface of the sapphire substrate 100. Thereafter, the substrate temperature was maintained at 400° C., and the AlN buffer layer 120 was formed on the sapphire substrate 100 through MOCVD. Then, the substrate temperature was elevated to 1,100° C. under a stream of hydrogen gas (carrier gas) and ammonia gas. Immediately after the substrate temperature had reached 1,100° C., the n-type contact layer 101 formed of GaN and having an Si concentration of $4.5 \times 10^{18}/cm^3$ was deposited on the buffer layer 120 by using TMG and ammonia gas as raw material gases, and silane gas as an impurity gas (FIG. 2A).

Subsequently, the ESD layer 102 was formed through the following processes. Firstly, on the n-type contact layer 101 was deposited, through MOCVD, the first ESD layer 110 formed of n-GaN and having a thickness of 200 to 1,000 nm and an Si concentration of $1 \times 10^{16}$ to $5 \times 10^{17}/cm^3$. The growth temperature was adjusted to 900° C. or higher so as to grow a high-quality crystal having a pit density of $1 \times 10^8/cm^2$ or less. When the growth temperature is adjusted to 1,000° C. or higher, a crystal of higher quality is grown, which is preferred.

Next, on the first ESD layer 110 was deposited, through MOCVD, the second ESD layer 111 formed of n-GaN and having a characteristic value, as defined by the product of Si concentration ($/cm^3$) and thickness (nm), of $0.9 \times 10^{20}$ to $3.6 \times 10^{20}$ ($nm/cm^3$). The growth temperature was adjusted to 800 to 950° C. Then, the third ESD layer 112 formed of undoped GaN and having a thickness of 50 to 200 nm was deposited on the second ESD layer 111 through MOCVD. The growth temperature was adjusted to 800 to 950° C. so as to grow a crystal having a carrier concentration of $5 \times 10^{17}/cm^3$ or less and a pit density of $2 \times 10^8/cm^2$ or more. When the growth temperature is adjusted to 800 to 900° C., the pit density is further increased, which is preferred.

Figure 2B:
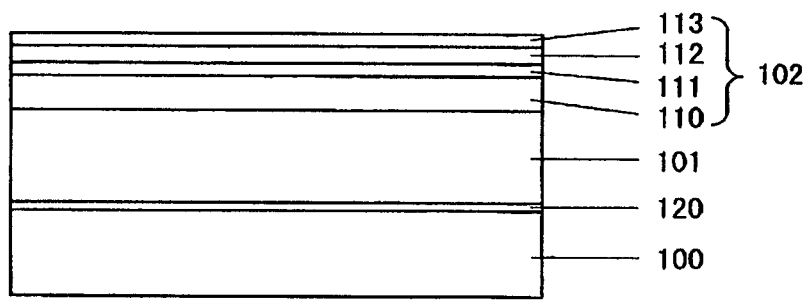
Figure 2C:
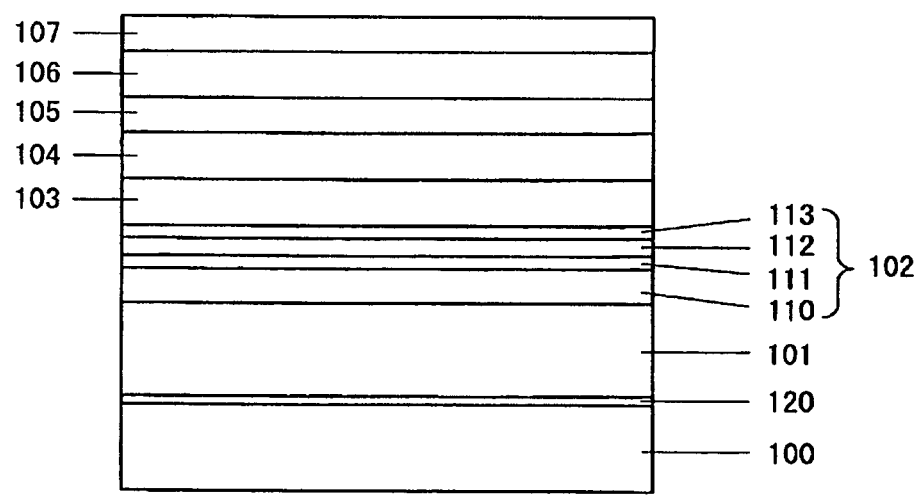

Subsequently, on the third ESD layer 112 was deposited, through MOCVD, the fourth ESD layer 113 formed of n-GaN and having a characteristic value, as defined by the product of Si concentration ($/cm^3$) and thickness (nm), of $0.9 \times 10^{20}$ to $3.6 \times 10^{20}$ ($nm/cm^3$). The growth temperature was adjusted to 800 to 950° C. Through these processes, the ESD layer 102 was formed on the n-type contact layer 101 (FIG. 2B).

Next, the n-type cladding layer 103 was formed on the ESD layer 102 through MOCVD. The n-type cladding layer 103 was formed by periodically stacking 15 layer units each including the undoped $In_{0.077}Ga_{0.923}N$ layer 131 (thickness: 4 nm), the undoped $Al_{0.2}Ga_{0.8}N$ layer 132 (thickness: 0.8 nm), and the Si-doped n-GaN layer 133 (thickness: 1.6 nm). The $In_{0.077}Ga_{0.923}N$ layer 131 was formed under supply of silane gas, TMG, TMI, and ammonia while the substrate temperature was maintained at 830° C. The $Al_{0.2}Ga_{0.8}N$ layer 132 was formed under supply of TMA, TMG, and ammonia while the substrate temperature was maintained at 830° C. The n-GaN layer 133 was formed under supply of TMG and ammonia while the substrate temperature was maintained at 830° C.

Then, the light-emitting layer 104 was formed on the n-type cladding layer 103. The light-emitting layer 104 was formed by periodically stacking eight layer units each including the following four layers: the $Al_{0.05}Ga_{0.95}N$ layer 141, the $In_{0.2}Ga_{0.8}N$ layer 142, the GaN layer 143, and the $Al_{0.2}Ga_{0.8}N$ layer 144. Each of the layers 141 to 144 was grown under supply of the corresponding raw material gases to form the light-emitting layer 104. In this case the growth temperature, i.e., the substrate temperature, of the $Al_{0.05}Ga_{0.95}N$ layer 141 was any temperature from 800° C. to 950° C. The growth temperature of $In_{0.2}Ga_{0.8}N$ layer 142, the GaN layer 143 and the $Al_{0.2}Ga_{0.8}N$ layer 144 was 770° C. Alternatively the growth temperature of the three layers 141, 142 and 143 may be commonly maintained at 770° C.

Subsequently, the undoped GaN layer 151 (thickness: 2.5 nm) was grown on the light-emitting layer 104 under supply of TMG and ammonia while the substrate temperature was maintained at 855° C. Then, while the substrate temperature was maintained at 855° C., the undoped $Al_{0.15}Ga_{0.85}N$ layer 152 (thickness: 3 nm) was grown under supply of TMA, TMG, and ammonia. Thus, the undoped cladding layer 105 was formed.

Next, the p-type cladding layer 106 was formed on the undoped cladding layer 105. The p-$In_{0.05}Ga_{0.95}N$ layer 161 (thickness: 1.7 nm) was formed under supply of $CP_2Mg$, TMI, TMG, and ammonia while the substrate temperature was maintained at 855° C., and the p-$Al_{0.3}Ga_{0.7}N$ layer 162 (thickness: 3.0 nm) was formed under supply of $CP_2Mg$, TMA, TMG, and ammonia while the substrate temperature was maintained at 855° C. This layer formation process was repeated seven times.

Then, while the substrate temperature was maintained at 1,000° C., the p-type contact layer 107 (thickness: 50 nm) formed of p-type GaN doped with Mg ($1 \times 10^{20}/cm^3$) was deposited by use of TMG, ammonia, and $CP_2Mg$. Thus, the device structure shown in FIG. 2C was formed. The p-type contact layer 107 may have an Mg concentration of $1 \times 10^{19}$ to $1 \times 10^{21}/cm^3$. The p-type contact layer 107 may have a thickness of 10 nm to 100 nm.

Subsequently, Mg was activated through thermal treatment, and then dry etching was performed from the top surface of the p-type contact layer 107, to thereby form a groove reaching the n-type contact layer 101. The p-electrode 108 was formed on the top surface of the p-type contact layer 107 from Rh/Ti/Au (which were stacked in this order on the p-type contact layer 107). Then, on the surface of the n-type contact layer 101 exposed at the bottom of the groove through dry etching, the n-electrode 130 was formed from V/Al/Ti/Ni/Ti/Au (which were stacked in this order on the n-type contact layer 101). Thus, the light-emitting device 1 shown in FIG. 1 was produced.

Figure 3:
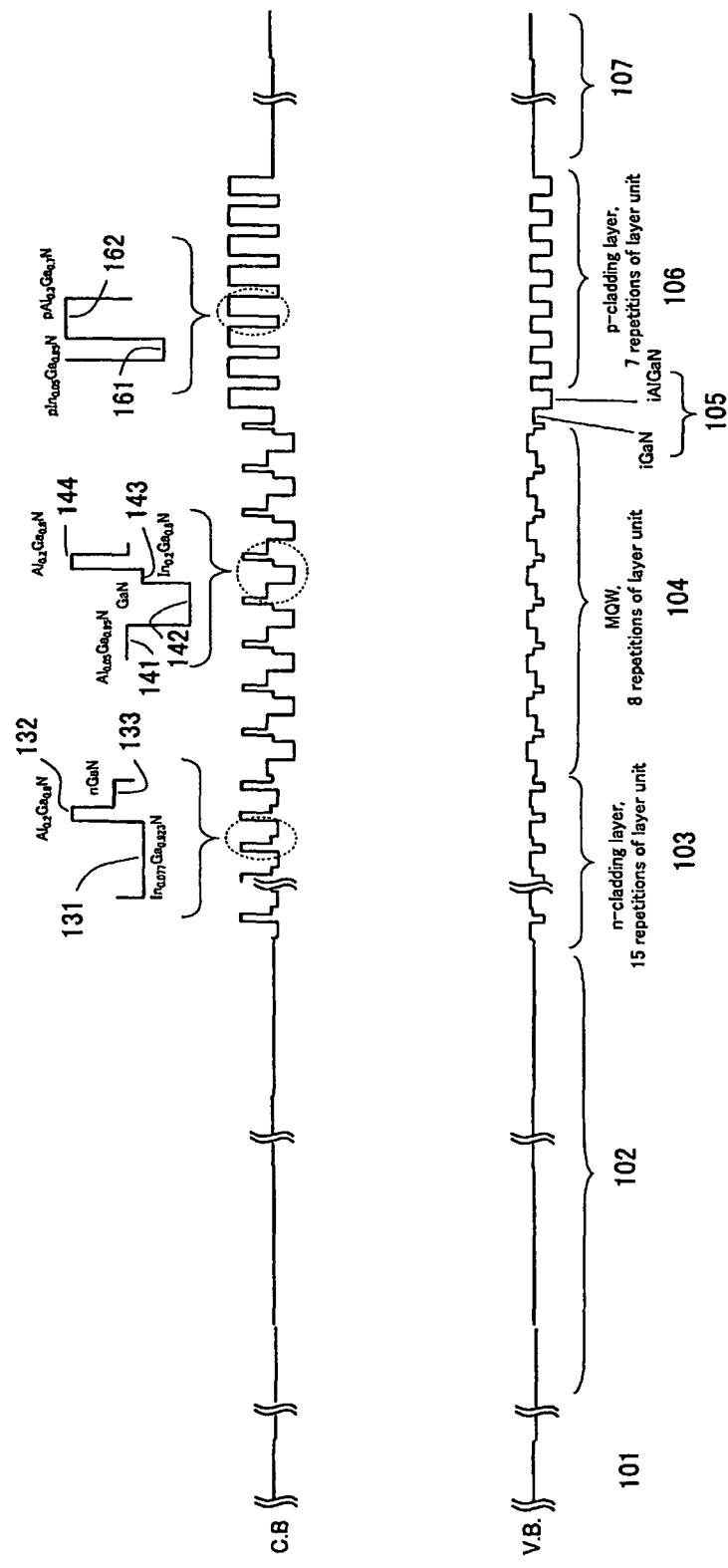
FIG. 3 shows the band structure of the light-emitting device according to Embodiment 1.

FIG. 3 shows the band structure of the light-emitting device 1. In the conduction band, the undoped $Al_{0.2}Ga_{0.8}N$ layer 132 of the n-type cladding layer 103 provides the highest potential barrier. However, since the $Al_{0.2}Ga_{0.8}N$ layer 132 has a thickness as small as 0.8 nm, electrons from the n-type contact layer 101 tunnel through the layer 132, and are injected into the light-emitting layer 104. Since a potential barrier is provided by addition of a p-type impurity between the light-emitting layer 104 and the p-type cladding layer 106, passage of electrons is blocked by the p-$Al_{0.3}Ga_{0.7}N$ layer 162 of the p-type cladding layer 106. Therefore, electrons are effectively confined in the light-emitting layer 104. Meanwhile, in the valence band, holes injected from the p-type contact layer 107, via the p-type cladding layer 106 and the undoped cladding layer 105, into the light-emitting layer 104 cannot tunnel through the undoped $Al_{0.2}Ga_{0.8}N$ layer 132 of the n-type cladding layer 103, although the $Al_{0.2}Ga_{0.8}N$ layer 132 has a thickness as small as 0.8 nm. That is, passage of holes is blocked by the layer 132. Thus, holes are effectively confined in the light-emitting layer 104. Therefore, emission performance can be improved without increasing driving voltage.

In the above-described embodiment, the n-type cladding layer 103 has a periodic structure including the undoped $In_{0.077}Ga_{0.923}N$ layer 131, the undoped $Al_{0.2}Ga_{0.8}N$ layer 132, and the Si-doped n-GaN layer 133, which are stacked in this order on the side of the n-type contact layer 101. However, the n-type cladding layer 103 may have a periodic structure in which the $In_{0.077}Ga_{0.923}N$ layer, the GaN layer, and the $Al_{0.2}Ga_{0.8}N$ layer are stacked in this order; the $Al_{0.2}Ga_{0.8}N$ layer, the GaN layer, and the $In_{0.077}Ga_{0.923}N$ layer are stacked in this order; or the $Al_{0.2}Ga_{0.8}N$ layer, the $In_{0.077}Ga_{0.923}N$ layer, and the GaN layer are stacked in this order. The $In_{0.077}Ga_{0.923}N$ layer 131 or the $Al_{0.2}Ga_{0.8}N$ layer 132 may be doped with Si, so as to serve as an n-type layer. The GaN layer 133 may be an undoped layer. The n-type cladding layer 103 is formed of 15 layer units, but the number of layer units is not limited thereto. For example, the number of layer units may be 3 to 30. The $Al_{0.2}Ga_{0.8}N$ layer 132 may have a thickness of 0.3 nm to 2.5 nm. The GaN layer 133 may have a thickness of 0.3 nm to 2.5 nm. The $In_{0.077}Ga_{0.923}N$ layer 131 may have a thickness of 1.5 nm to 5.0 nm. The $Al_xGa_{1-x}N$ layer 132 may have a compositional proportion x of 0.05 to 1. The compositional proportion x is preferably 0.1 to 0.8, more preferably 0.2 to 0.6. In the case where the $Al_xGa_{1-x}N$ layer 132 is formed of AlN, even when the layer has a thickness as small as 0.3 nm, electrons can tunnel through the layer, and passage of holes can be blocked by the layer. Meanwhile, in the case where the $Al_xGa_{1-x}N$ layer 132 is formed of $Al_{0.05}Ga_{0.95}N$, the layer 132 must have a thickness as large as 2.5 nm. Thus, the $Al_xGa_{1-x}N$ layer 132 may have a thickness of 0.3 nm to 2.5 nm. Since one of the layers forming the periodic structure of the p-type cladding layer 106 is the p-$Al_{0.3}Ga_{0.7}N$ layer 162, the Al compositional proportion x of the $Al_xGa_{1-x}N$ layer 132 of the n-type cladding layer 103 is preferably adjusted to 0.15 or more. Generally, the Al compositional proportion x of the $Al_xGa_{1-x}N$ layer 132 of the n-type cladding layer 103 is preferably adjusted to z/2 or more (wherein z is the Al compositional proportion of the $Al_zGa_{1-z}$ N layer 162, which is one of the layers forming the periodic structure of the p-type cladding layer 106).

Embodiment 2

Figure 4:
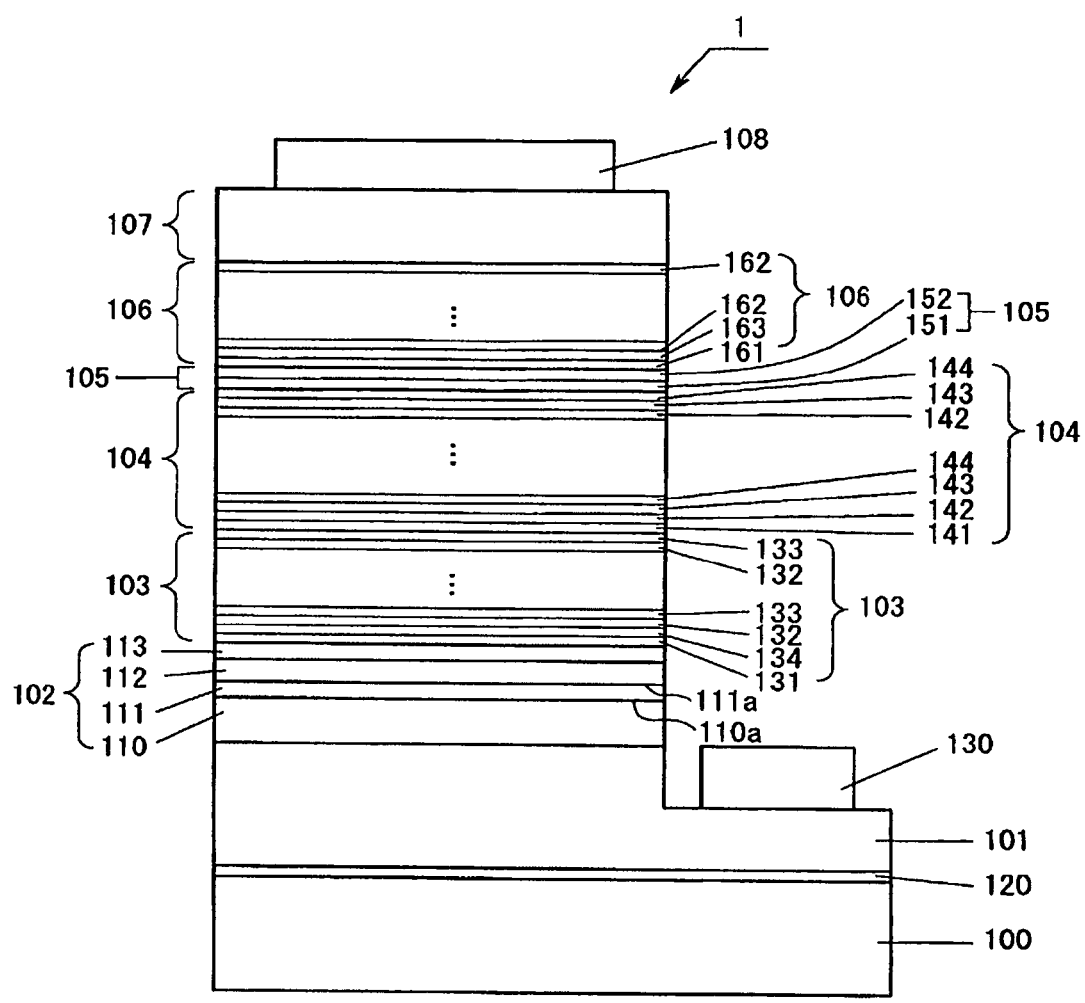
FIG. 4 shows the configuration of a light-emitting device 1 according to Embodiment 2.
Figure 5:
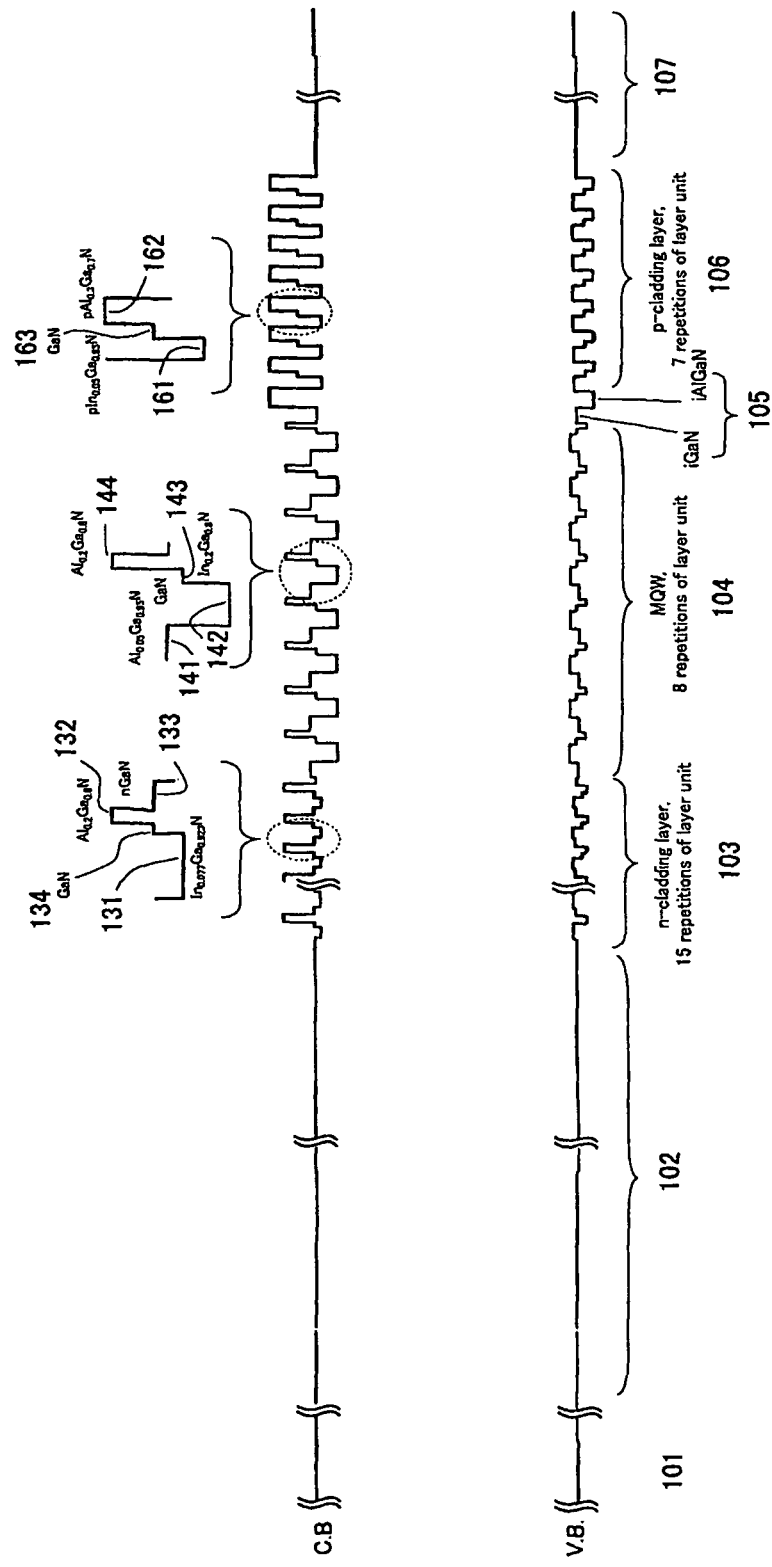
FIG. 5 shows the band structure of the light-emitting device according to Embodiment 2.

As shown in FIGS. 4 and 5, the light-emitting device according to the present embodiment has the same configuration as the light-emitting device according to Embodiment 1, except that the n-type cladding layer 103 includes an undoped GaN layer 134 (thickness: 1 nm) interposed between the undoped $In_{0.077}Ga_{0.923}N$ layer 131 and the undoped $Al_{0.2}Ga_{0.8}N$ layer 132. When the $Al_{0.2}Ga_{0.8}N$ layer 132 is grown directly on the $In_{0.077}Ga_{0.923}N$ layer 131, the difference in lattice constant between these two layers increases, and crystal defects may be generated at the interface between the $In_{0.077}Ga_{0.923}N$ layer 131 and the $Al_{0.2}Ga_{0.8}N$ layer 132. In addition, since raw material gases employed for growth of the $In_{0.077}Ga_{0.923}N$ layer 131 remain in the piping or the crystal growth apparatus, an $Al_xGa_{1-x-y}In_yN$ (0<x<1, 0<y<1, 0<x+y<1) layer may be formed at the interface between the layers 131 and 132. The thus-formed layer may deteriorate characteristics, and may prevent formation of a sharp band structure. In order to avoid such problems, the undoped GaN layer 134 is formed on the $In_{0.077}Ga_{0.923}N$ layer 131, and the $Al_{0.2}Ga_{0.8}N$ layer 132 is formed on the GaN layer 134, whereby crystallinity can be improved, and an appropriate band structure can be attained. In this case, even when In is incorporated into the GaN layer 134 at an initial stage of growth, the GaN layer 134 is continuous with the $In_{0.077}Ga_{0.923}N$ layer 131 in terms of composition and band structure, or even when Al is incorporated into the GaN layer 134 at an final stage of growth, the GaN layer 134 is continuous with the $Al_{0.2}Ga_{0.8}N$ layer 132 in terms of composition and band structure. Thus, crystallinity can be improved, and formation of an $Al_xGa_{1-x-y}In_yN$ layer can be prevented, whereby characteristics of the device can be improved.

The undoped GaN layer 134 may have a thickness of 0.3 nm to 2.5 nm. The GaN layer 134 may be doped with Si. Even when the order in Embodiment 1 of stacking of the undoped $In_{0.077}Ga_{0.923}N$ layer 131, the undoped $Al_{0.2}Ga_{0.8}N$ layer 132, and the Si-doped n-GaN layer 133 is changed to any order, the GaN layer may be provided between the InGaN layer and the AlGaN layer.

Problems similar to those described above may arise in the p-type cladding layer 106. Therefore, a p-GaN layer 163 (thickness: 1 nm) may be provided between the p-$In_{0.05}Ga_{0.95}N$ layer 161 and the p-$Al_{0.3}Ga_{0.7}N$ layer 162 of the p-type cladding layer 106 of the device according to Embodiment 1. In this case, the p-GaN layer 163 may have a thickness of 0.3 nm to 2.5 nm. The GaN layer 163 may be an undoped layer. Also the Mg-doped GaN layer 163 may be provided at an interface changing from the p-$Al_{0.3}Ga_{0.7}N$ layer 162 to the p-$In_{0.05}Ga_{0.95}N$ layer 161. In this case the Mg-doped GaN layers 163 are formed at the both sides of the p-$Al_{0.3}Ga_{0.7}N$ layer 162. The GaN layers may be undoped.

Especially the n-type cladding layer 103 must have a good crystallinity because the light-emitting layer 104 is deposited on the n-type cladding layer 103. On the contrary the p-type cladding layer 106 is not required a good crystallinity compared with the n-type cladding layer 103 because the light-emitting layer 104 required a good crystallinity is not deposited on the p-type cladding layer 106. Accordingly it is more important and higher effective that GaN layer formed between InGaN layer and AlGaN layer is formed in the n-type cladding layer than formed in the p-type cladding layer.

The Group III nitride semiconductor light-emitting device of the present invention exhibits improved emission performance without increasing driving voltage.

What is claimed is:

1. A Group III nitride semiconductor light-emitting device comprising:
   an n-type-layer-side cladding layer, a light-emitting layer, and a p-type-layer-side cladding layer, each of the layers comprising a Group III nitride semiconductor,
   wherein the n-type-layer-side cladding layer comprises a superlattice layer having a periodic structure comprising four layers as one periodic unit,
   wherein the periodic unit comprises a first GaN layer, an $In_yGa_{1-y}N$ (0<y<1) layer, a second GaN layer with a thickness of 0.3 nm to 2.5 nm, and an $Al_xGa_{1-x}N$ (0<x<1) layer,
   wherein the second GaN layer is interposed between the $In_yGa_{1-y}N$ (0<y<1) layer and the $Al_xGa_{1-x}N$ (0<x<1) layer,
   wherein the $Al_xGa_{1-x}N$ (0<x<1) layer has a thickness of 0.3 nm to 2.5 nm such that electrons tunnel through the $Al_xGa_{1-x}N$ layer,
   wherein the $Al_xGa_{1-x}N$ (0<x<1) layer has an Al compositional proportion x of 0.05 or more and less than 1,
   wherein the light-emitting layer comprises a multiple quantum well structure comprising a first AlGaN layer, an InGaN layer, a GaN layer and a second AlGaN layer having an Al compositional proportion higher than the first AlGaN layer as one periodic unit,
   wherein the p-type-layer-side cladding layer comprises a superlattice layer having a periodic structure comprising an $In_wGa_{1-w}N$ layer and an $Al_zGa_{1-z}N$ (0<z<1) layer,
   wherein the $Al_xGa_{1-x}N$ (0<x<1) layer of the n-type-layer-side cladding layer has a compositional proportion x not less than ½ of the compositional proportion z of the $Al_zGa_{1-z}N$ (0<z<1) layer of the p-type-layer-side cladding layer, and
   wherein the light-emitting layer is formed directly on the n-type-layer-side cladding layer.

2. A Group III nitride semiconductor light-emitting device according to claim 1, wherein the second GaN layer is undoped.

3. A Group III nitride semiconductor light-emitting device according to claim 1, wherein the first GaN layer is doped with Si.

4. A Group III nitride semiconductor light-emitting device according to claim 2, wherein the first GaN layer is doped with Si.

5. A Group III nitride semiconductor light-emitting device according to claim 1, wherein the first GaN layer is undoped.

6. A Group III nitride semiconductor light-emitting device according to claim 1, wherein the periodic structure of the n-type-layer-side cladding layer has 3 to 30 periodic units.

7. A Group III nitride semiconductor light-emitting device according to claim 1, wherein the second GaN layer is deposited on the $In_yGa_{1-y}N$ (0<y<1) layer and the first GaN layer is deposited on the $Al_xGa_{1-x}N$ (0<x<1) layer.

8. A Group III nitride semiconductor light-emitting device according to claim 4, wherein the second GaN layer is deposited on the $In_yGa_{1-y}N$ (0<y<1) layer and the first GaN layer is deposited on the $Al_xGa_{1-x}N$ (0<x<1) layer.

9. A Group III nitride semiconductor light-emitting device according to claim 1, wherein the $In_yGa_{1-y}N$ (0<y<1) layer, the $Al_xGa_{1-x}N$ (0<x<1) layer or the second GaN layer contains Si.

* * * * *